(12) United States Patent
Nakano et al.

(10) Patent No.: US 8,134,419 B2
(45) Date of Patent: Mar. 13, 2012

(54) DIGITAL HIGH-FREQUENCY GENERATOR CIRCUIT

(75) Inventors: Kazuo Nakano, Chigasaki (JP); Syuhei Amakawa, Higashihiroshima (JP); Noboru Ishihara, Atsugi (JP); Kazuya Masu, Kawasaki (JP)

(73) Assignee: Semiconductor Technology Academic Research Center (JP)

( * ) Notice: Subject to any disclaimer, the term of this patent is extended or adjusted under 35 U.S.C. 154(b) by 30 days.

(21) Appl. No.: 12/848,532

(22) Filed: Aug. 2, 2010

(65) Prior Publication Data

US 2011/0037502 A1 Feb. 17, 2011

(30) Foreign Application Priority Data

Aug. 14, 2009 (JP) ................. 2009-188066

(51) Int. Cl.
*H03K 3/03* (2006.01)
(52) U.S. Cl. .......................... 331/179; 331/57
(58) Field of Classification Search ............ 331/57, 331/177 R, 179; 327/105–106
See application file for complete search history.

(56) References Cited

U.S. PATENT DOCUMENTS 3,893,174 A * 7/1975 Sano et al. ............ 348/809

FOREIGN PATENT DOCUMENTS

| JP | 8-204558 | 8/1996 |
|---|---|---|
| JP | 09-199999 | 7/1997 |
| JP | 2000-323966 | 11/2000 |
| JP | 2002-280838 | 9/2002 |
| JP | 2005-303990 | 10/2005 |
| JP | 2005-531952 | 10/2005 |

OTHER PUBLICATIONS

Japanese Office Action for Application No. 2009-188066 dated Jul. 12, 2011 with English Translation (5 pages).

\* cited by examiner

*Primary Examiner* — David Mis
(74) *Attorney, Agent, or Firm* — Harness, Dickey & Pierce, P.L.C.

(57) ABSTRACT

A high-frequency generator circuit comprises a signal generating circuit, a delay unit, a selector, a synthesizer circuit, and a controller. The signal generating circuit generates a signal having the same frequency as an output signal. The delay unit includes a plurality of delay circuits, and delays the signal generated by the signal generating circuit. The selector selects an output signal of the delay circuits. The synthesizer circuit synthesizes the signal selected by the selector, and outputs the output signal. The controller controls the selector based on data for setting a waveform of the output signal and a control signal for setting at least amplitude, phase and frequency of the output signal.

13 Claims, 10 Drawing Sheets

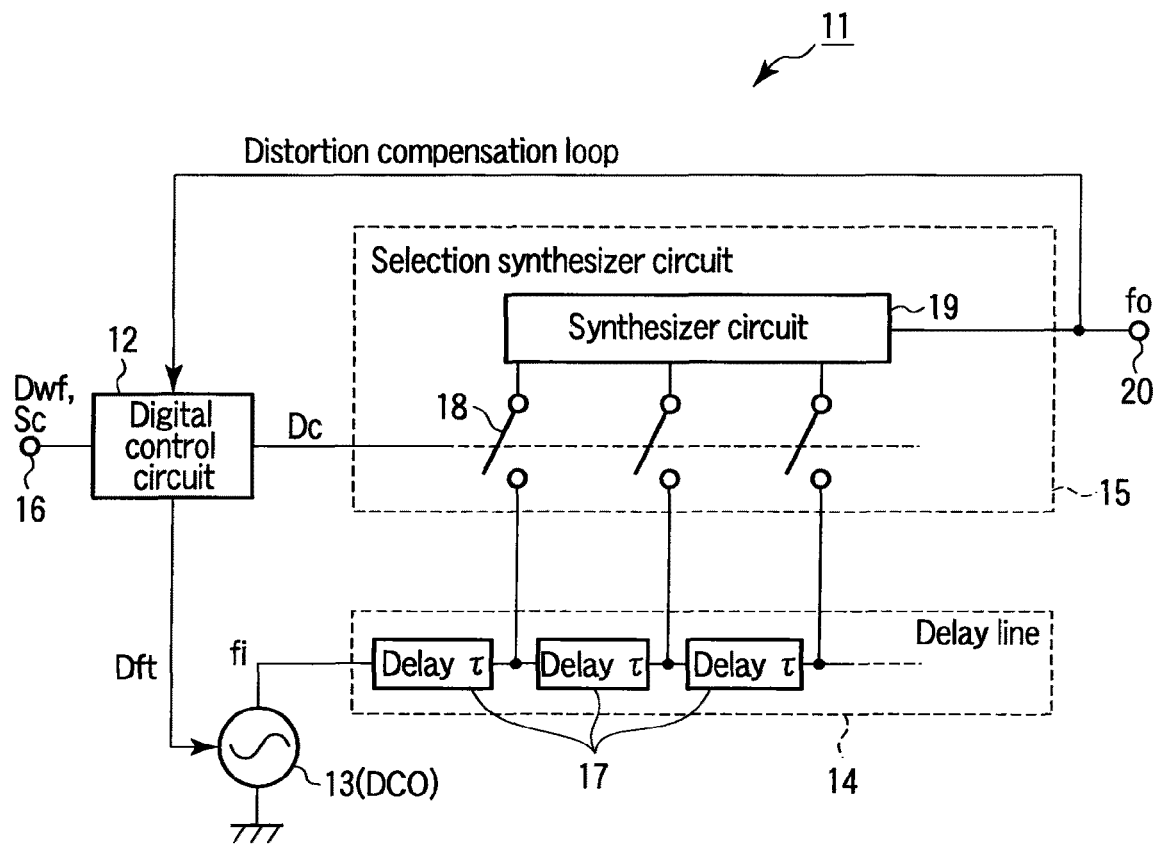
F I G. 1
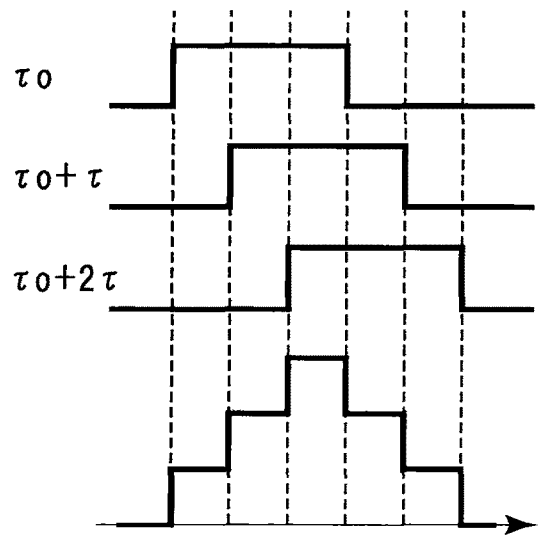
F I G. 2

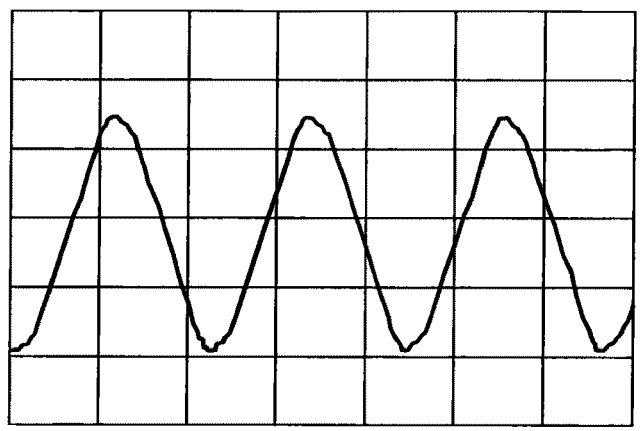
F I G. 3
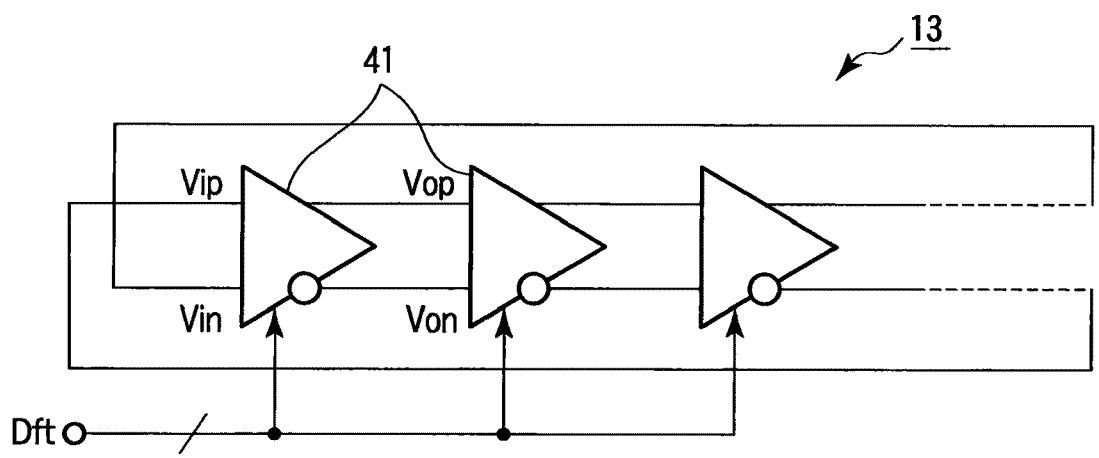
F I G. 4

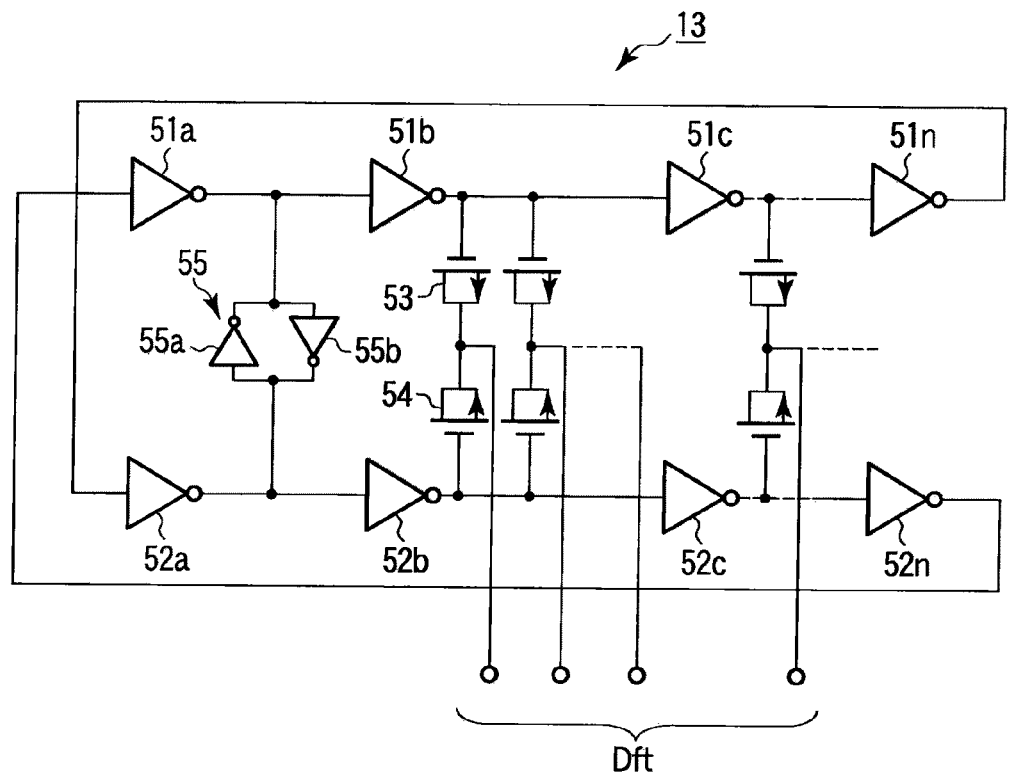
F I G. 7
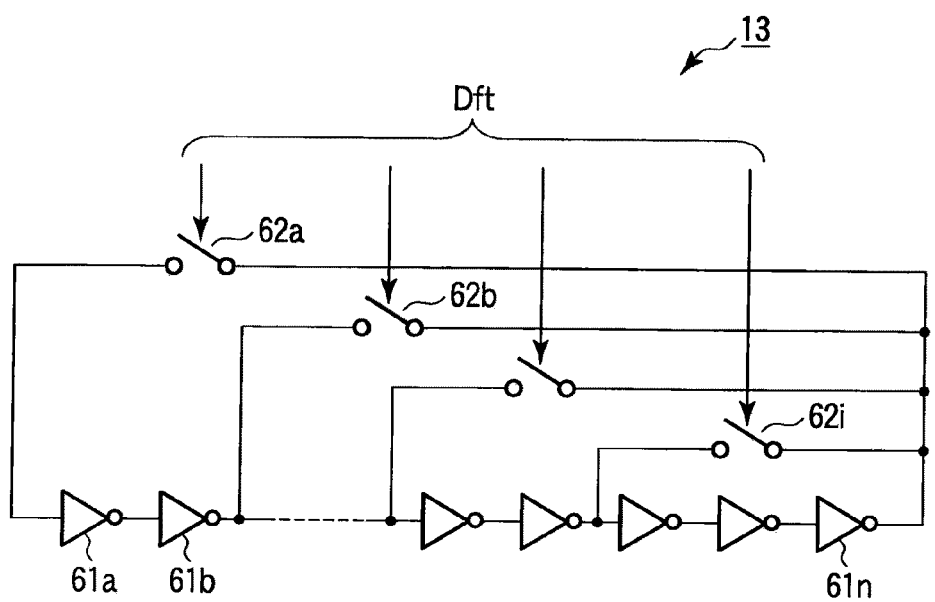
F I G. 8

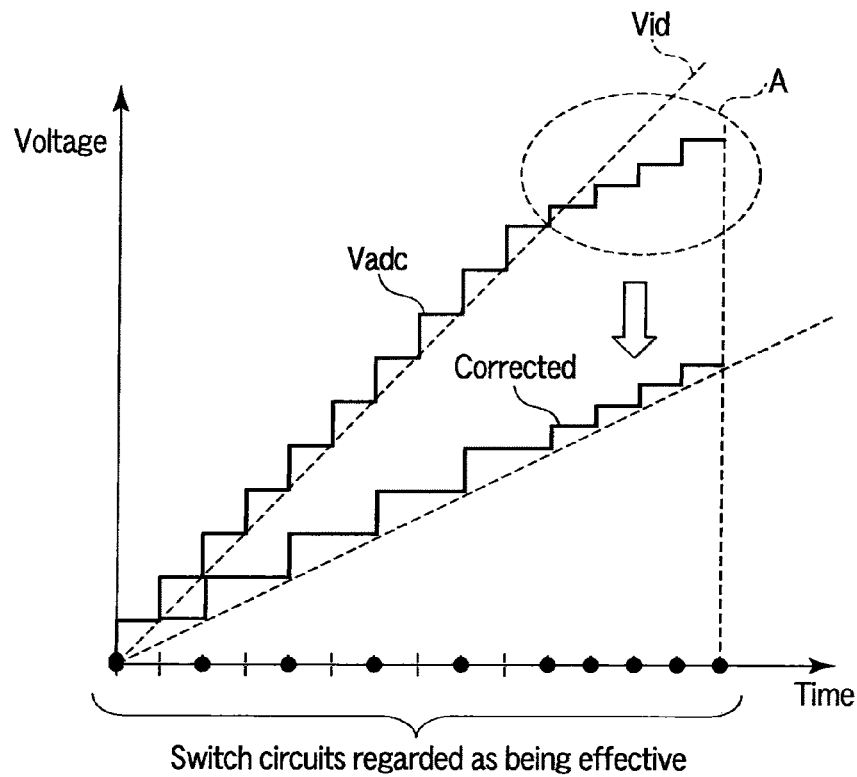
F I G. 15
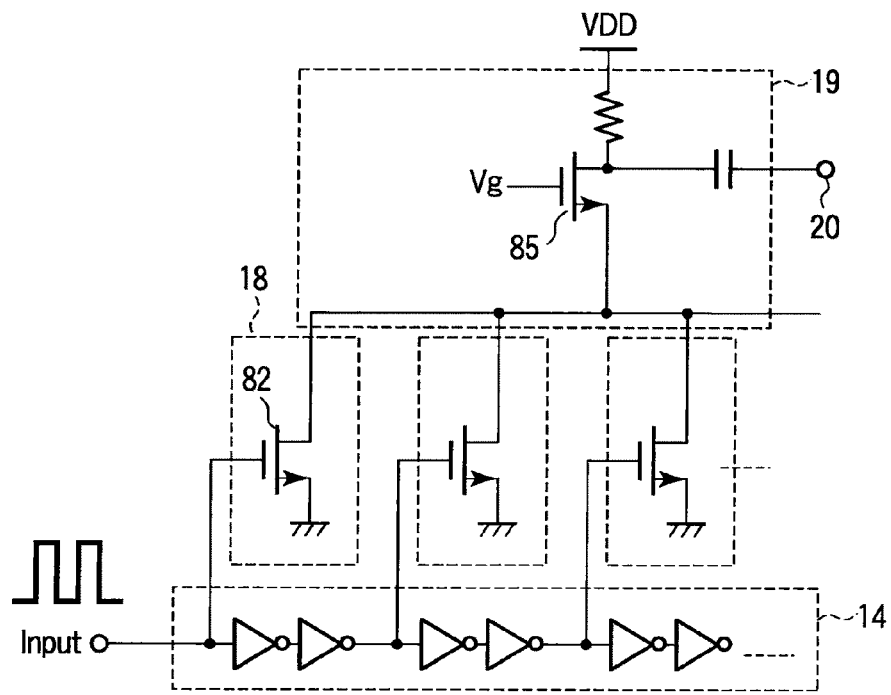
F I G. 16

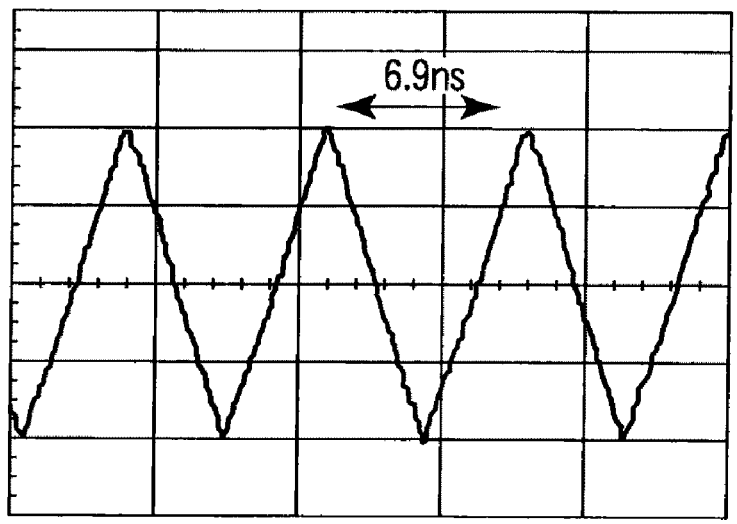
F I G. 18A
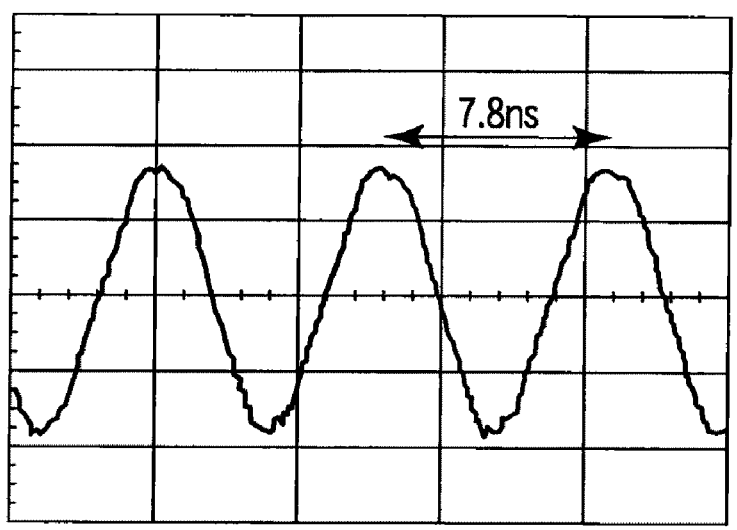
F I G. 18B

DIGITAL HIGH-FREQUENCY GENERATOR CIRCUIT

CROSS-REFERENCE TO RELATED APPLICATIONS

This application is based upon and claims the benefit of priority from prior Japanese Patent Application No. 2009-188066, filed Aug. 14, 2009, the entire contents of which are incorporated herein by reference.

BACKGROUND OF THE INVENTION

1. Field of the Invention

The present invention relates to a high-frequency generator circuit, which is applied to a semiconductor integrated circuit, for example.

2. Description of the Related Art

A high-frequency radio communication transmitter circuit has the following configuration. Specifically, the circuit orthogonally modulates a sine wave signal from an oscillator circuit and data signals I and Q using a mixer circuit. Then, the circuit amplifies these signals using an amplifier so that they are transmitted as a radio signal. The oscillator circuit forming the transmitter circuit, mixer circuit and amplifier circuit basically has a narrow band. For example, the mixer circuit is configured using an inductor (L) and a capacitor (C) given as a passive element. In a high-frequency radio communication transmitter circuit applied to a semiconductor integrated circuit, the passive elements needs to use a fixed value in order to realize the same operation band characteristic. For this reason, the size of these passive elements can not keep up with the scale reduction of transistors. This is a factor of causing the following problem. Namely, the area with respect to a chip of a circuit unit comprising transistors is reduced, but the area of a circuit unit comprising the passive elements is not reduced. Therefore, the area occupation ratio of the passive elements becomes large in a radio communication LSI including a digital processing circuit. As a result, this is a factor of limiting low-cost reduction in a fine process. Considering the circumstances, the following research and development has been advanced. Specifically, the transmitter circuit is not configured using mainly a conventional analog circuit, but a high-frequency signal and a radio signal are generated using a digital circuit.

For example, the following methods are given as the technique of generating a high-frequency signal and a radio signal using a digital circuit.

(1) Method of using a digital-to-analog converter circuit (DAC) (e.g., see Jpn. Pat. Appln. KOKAI Publication No. 8-204558)

(2) Method of using a digital-direct synthesizer circuit (DDS) (e.g., see Jpn. Pat. Appln. KOKAI Publication No. 2002-280838)

According to the method of using the DAC, digital data is processed by the DAC to generate a desired sine wave signal. Moreover, the method of using the DDS is basically the same as the method of using the DAC, and a sine wave signal is generated by a DAC having built-in memory and digital control circuit.

However, circuits disclosed in the methods (1) and (2) both require a high clock frequency more at least twice than a radio frequency. For example, if a high-frequency radio signal of the order of GHz or higher is generated, energy consumption of a circuit increases. Moreover, in order to obtain a high signal noise ratio of 60 dB or more, which is generally required for radio communications, ten-bit or higher resolution is required; for this reason, the circuit configuration becomes complicate. Further, circuits disclosed in the methods (1) and (2) are a voltage mode circuit; for this reason, if a power supply voltage is reduced with the scale reduction, there is a problem that resolution is reduced.

Furthermore, circuits disclosed in the methods (1) and (2) merely generates a signal of several hundred MHz at present; for this reason, these circuits is not adaptable to a high-frequency radio communication transmitter circuit, which operates at a frequency of the order of GHz or higher. Therefore, it is desired to provide a high-frequency radio communication transmitter circuit, which operates over a wide band at low voltage, and is capable of reducing the circuit area.

BRIEF SUMMARY OF THE INVENTION

According to an aspect of the invention, there is provided a high-frequency generator circuit comprising: a signal generating circuit configured to generate a signal having the same frequency as an output signal; a delay unit including a plurality of delay circuits, and configured to delay the signal generated by the signal generating circuit; a selector configured to select an output signal of the delay circuits; a synthesizer circuit configured to synthesize the signal selected by the selector, and to output the output signal; and a controller configured to control the selector based on data for setting a waveform of the output signal and a control signal for setting at least amplitude, phase and frequency of the output signal.

BRIEF DESCRIPTION OF THE SEVERAL VIEWS OF THE DRAWINGS

FIG. 1 is a circuit diagram showing the configuration of a high-frequency signal generator circuit according to one embodiment;

FIG. 2 is a waveform chart schematically showing the operation of the circuit shown in FIG. 1;

FIG. 3 is a waveform chart schematically showing the operation of the circuit shown in FIG. 1;

FIG. 4 is a circuit diagram showing the configuration of a digital control oscillator circuit shown in FIG. 1;

FIG. 7 is a circuit diagram showing another configuration of a digital control oscillator circuit shown in FIG. 1;

FIG. 8 is a circuit diagram showing another configuration of a digital control oscillator circuit shown in FIG. 1;

FIG. 15 is a graph to explain a compensation mode operation of the data control circuit shown in FIG. 13;

FIG. 16 is a circuit diagram showing an embodiment for verification;

FIGS. 18A and 18B are signal waveforms generated by the integrated circuit shown in FIG. 17.

DETAILED DESCRIPTION OF THE INVENTION

Figure 5:
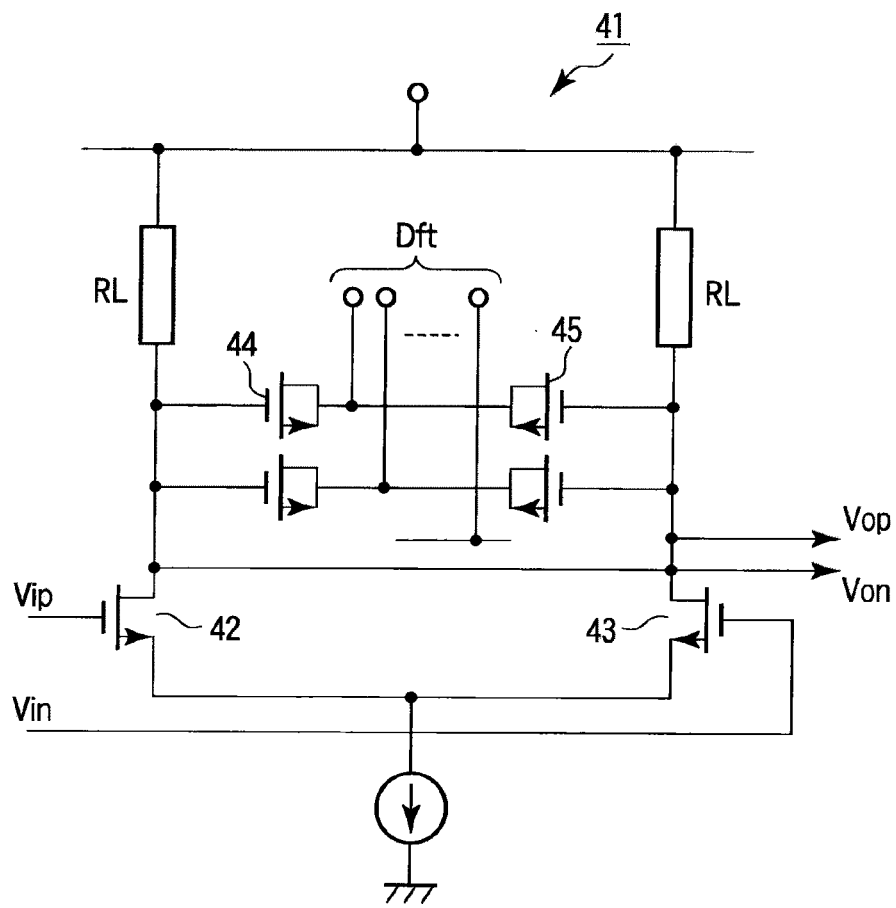
FIG. 5 is a circuit diagram showing the configuration of a part of the circuit shown in FIG. 4.

One embodiment of the present invention will be hereinafter described with reference to the accompanying drawings.

FIG. 1 is a circuit diagram showing the configuration of a high-frequency signal generator circuit according to one embodiment. This embodiment relates to a scalable high-frequency signal generator circuit, which is operable over a wide band at a low power supply voltage. This circuit is not a signal generator circuit using a conventional voltage control. According to this embodiment, the time base (timing axis) of a digital signal is controlled; namely, time-to-analog conversion is employed to generate a high-frequency signal. Moreover, this circuit is configurable using a basic digital circuit of an inverter circuit level without using an inductor given as a passive element, and operable at a low power supply voltage.

A high-frequency signal generator circuit shown in FIG. 1 mainly comprises a digital control circuit 12, a digital control oscillator circuit (DCO) 13, a delay line 14 and a selection and synthesizer circuit 15.

For example, the digital control circuit 12 basically comprises a memory and an operation circuit as described later. The memory stores a waveform data Dwf supplied from an input terminal 16. The operation circuit operates a digital signal based on a control signal Sc supplied from the input terminal 16. This control signal Sc includes the following data; specifically, one is data for setting a waveform, amplitude, a phase and a frequency, which are required for generating a high-frequency signal. The other is data for setting amplitude, a phase and a frequency, which are required for modulation.

The digital control circuit 12 has a plurality of functions. Specifically, the circuit 12 generates a digital signal Dft for controlling an oscillation frequency of the DCO 13 based on the control signal Sc. Further, the circuit 12 controls switch circuits 18 of a selection and synthesizer circuit 15 to select a delay signal in order to generate a high-frequency signal based on the waveform data stored in the memory. Furthermore, the circuit 12 monitors an output signal waveform of the selection and synthesizer circuit 15 to generate compensation data, and in this way, compensates a waveform distortion of an output signal. In addition, the circuit 12 has a modulation function of controlling the switch circuits 18 based on the waveform data Dwf and the control signal Sc so that the amplitude, phase and frequency of a high-frequency signal is changed.

For example, the DCO 13 comprises a ring oscillator circuit and an oscillation frequency is controlled based on a digital signal Dft supplied from the digital control circuit 12. This DCO 13 generates a rectangular pulse signal having the same frequency as a high-frequency signal output from an output terminal 20 of the selection and synthesizer circuit 15.

For example, the delay line 14 comprises a plurality of delay circuit 17 having a unit delay time τ. The delay line 14 delays a pulse signal fi output from the DCO 13, and thereafter, generates a plurality of delay signals having different delay.

The selection and synthesizer circuit 15 comprises a plurality of switch circuits 18 and a synthesizer circuit 19. Specifically, these switch circuits 18 select a plurality of delay signals generated by the delay line 14. The synthesizer circuit 19 is connected to each output terminal of the switch circuits 18 to synthesize a signal selected by the switch circuit, and converts the selected signal into a voltage signal. The switch circuit 18 selects a signal output from the delay line 14 based on control data Dc supplied from the digital control circuit 12. The synthesizer circuit 19 synthesizes an output current of the selected switch circuit 18, and then, converts the current into a voltage. A signal converted into the voltage is output from the output terminal 20.

The operation of the high-frequency signal generator circuit is as follows.

First, the digital control circuit 12 determines an oscillation frequency of the DCO 13 based on a control signal. The DCO 13 outputs a rectangular pulse signal having a designated frequency based on a digital signal Dft supplied from the digital control circuit 12. The delay line 14 delays a pulse signal supplied from the DCO 13, and then, outputs a plurality of pulse signals shifted every unit delay time τ. The selection and synthesizer circuit 15 selects and synthesizes a pulse signal output from the delay line 14 based on control data supplied from the digital control circuit 12.

As seen from FIG. 2, a pulse signal delayed at predetermined intervals by the delay line 14 is synthesized, and thereby, a triangular wave is formed. A signal to be synthesized is selected from delayed pulse signals by the selection and synthesizer circuit 15, and thereby, an arbitrary waveform signal is generated.

FIG. 3 shows the simulation result of a sine wave generation. Specifically, FIG. 3 shows the result synthesizing a pulse signal using a delay line having five-bit (32 stages) delay circuits. A signal waveform distortion is reduced by increasing the number of delay circuits or by compensating the distortion using the digital control circuit 12. Modulation of a radio signal is realizable by selectively changing a pulse signal output from the delay line 14 based on waveform data Dwf and control signal Sc in the digital control circuit 12.

Incidentally, a distortion compensation loop shown in FIG. 1 functions as a loop for compensating a nonlinear operation of the selection and synthesizer circuit 15. This loop is activated only when compensation data is generated, as described later.

FIG. 4 shows one configuration example of the DCO 13. For example, this DCO 13 comprises a differential ring oscillator circuit. Specifically, a plurality of differential circuits 41 is connected in series, and an output signal of the final-stage differential circuit is positively fed back to an input terminal of the first-stage differential circuit. Each differential circuit 41 is supplied with a digital signal Dft output from the digital control circuit 12.

FIG. 5 shows one configuration example of the differential circuit 41 shown in FIG. 4. In FIG. 5, the same reference numbers are used to designate portions identical to FIG. 4. In FIG. 5, several pairs of varactors 44 and 45 functioning as a variable capacitor are connected in parallel between drains of N-channel MOS transistors 42 and 43. Each of varactors 44 and 45 comprises a MOS capacitor, for example. In each pair of varactors 44 and 45, a connection node of varactors 44 and 45 is supplied with a digital signal Dft. The capacitance of varactors 44 and 45 is digitally changed according to a voltage of the digital signal Dft.

Figure 6:
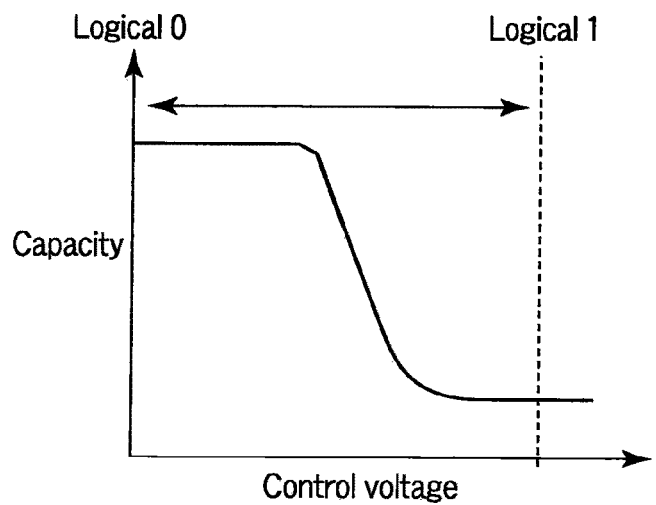
FIG. 6 is a chart to explain the operation of a varactor shown in FIG. 4.

FIG. 6 shows the relationship between the voltage and the capacitance of varactors 44 and 45. The logic level of the digital signal Dft is successively changed, and thereby, the capacitance of varactors 44 and 45 is changeable. Therefore, the capacitance of several varactor pairs is discretely changeable using the digital signal Dft. The oscillation frequency of the DCO 13 is determined depending on the number of stages of the differential circuit 41 and on a delay time of the circuit. Thus, the capacitance of the varactor pair is changed to change a delay time, and in this way, the oscillation frequency of the DCO 13 is digitally controllable.

FIG. 7 shows another configuration example of a DCO 13. For example, this DCO 13 comprises a plurality of inverter circuits 51a, 51b, . . . , 51n, 52a, 52b, . . . , 52n, which are connected in series, a plurality of pairs of varactor 53 and 54 functioning as a variable capacitor element and a latch circuit 55. Namely, the following configuration is employed in order to realize a differential operation by the combination of single-end several inverter circuits. Specifically, an output terminal of the inverter circuit 51n of series-connected inverters 51a, 51b, . . . , 51n is connected to an input terminal of the inverter circuit 52n of series-connected inverters 52a, 52b, . . . , 52n. Moreover, an output terminal of the inverter circuit 52n of series-connected inverters 52a, 52b, . . . , 52n is connected to an input terminal of the inverter circuit 51n of series-connected inverters 51a, 51b, . . . , 51n. Further, a latch circuit 55 is interposed between output terminals of inverter circuits 51a and 52a.

Inverter circuits 55a and 55b forming the latch circuit 55 has a size smaller than other inverter circuits 51a, 51b, . . . , 51n, 52a, 52b, . . . , 52n. Therefore, the latch circuit 55 is operable at a high speed, and the differential change operation is smoothly performed. In FIG. 7, one latch circuit 55 only is inserted; in this case, this latch circuit 55 is connectable between all outputs of inverter circuits 51a to 51n and 52a to 52n or at proper intervals in order to obtain an effective differential operation.

Moreover, several pairs of varactors 53 and 54 are connected between output terminals of inverter circuits 51, 51c, . . . , and 52b, 52c, . . . . A connection node of varactors 53 and 54 is supplied with a digital data signal Dft. Even if a pair of varactors 53 and 54 I connected between terminals of inverter circuits 51a and 52b, the same effect is obtained.

In the DCO 13 shown in FIG. 7, the oscillation frequency is digitally controlled according to a digital signal Dft as well as the DCO 13 shown in FIGS. 4 and 5. This circuit comprises an inverter circuit; therefore, the circuit is operable at low voltage, and thus, advantageous to a wide-band operation.

FIG. 8 shows still another configuration example of a DCO 13. This DCO 13 has the following configuration. For example, in a ring oscillator circuit, the number of stages of several series-connected inverter circuits 61a, 61b, . . . , 61n is changed using a plurality of switches 62a, 62b, . . . , 62i. These switches 62a, 62b, . . . , 62i are controlled according to a digital signal Dft output from a digital control circuit.

According to the configuration shown in FIG. 8, an oscillation frequency is dynamically changeable based on a digital signal Dft. Specifically, if the number of stages of inverter circuits increases, the oscillation frequency becomes low. Conversely, if the number of stages of inverter circuits decreases, the oscillation frequency becomes high. This example is based on an inverter ring oscillator circuit; in this case, this example is applicable to a differential ring oscillator circuit shown in FIGS. 4 and 7. In also case, it is possible to realize a high-accuracy digital control oscillator circuit having a wider band.

Moreover, if a multi-stage ring oscillator circuit DCO is used, an oscillation signal having different delay is fetched from a plurality of stages. This serves to omit the delay line 14 in the configuration shown in FIG. 1. However, if the number of stages is increased in a ring oscillator circuit DCO, an oscillation frequency becomes low; for this reason, there is a need to consider target frequency and resolution.

Figure 9:
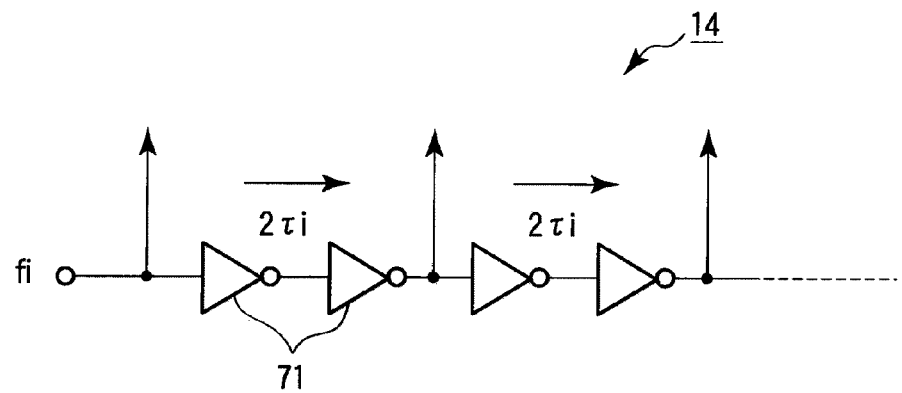
FIG. 9 is a circuit diagram showing the configuration of a delay line shown in FIG. 1.
Figure 10:
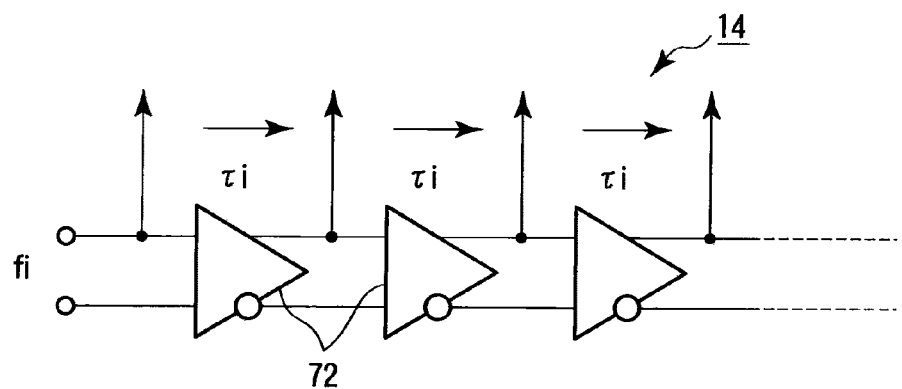
FIG. 10 is a circuit diagram showing another configuration of a delay line shown in FIG. 1.
Figure 11:
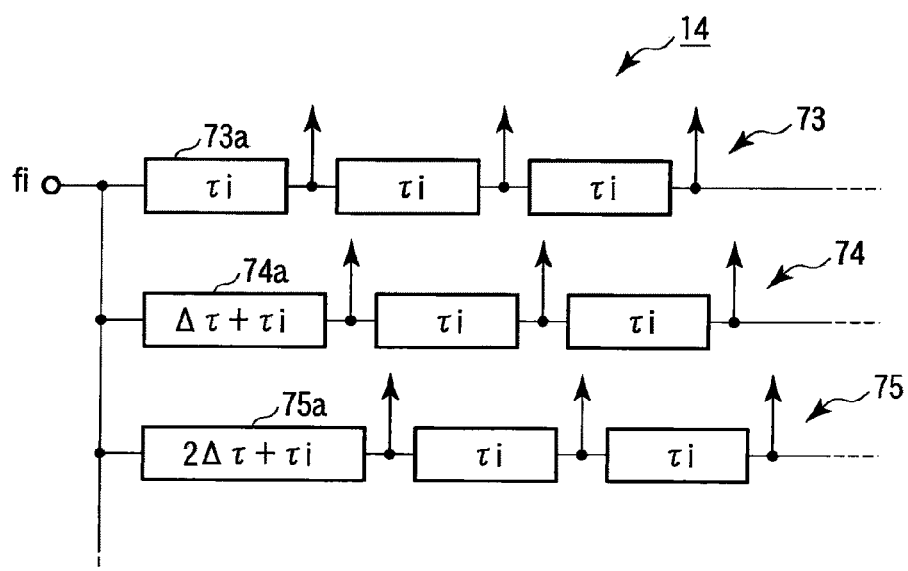
FIG. 11 is a circuit diagram showing another configuration of a delay line shown in FIG. 1.

FIGS. 9 to 11 each show the configuration example of a delay line 14.

FIG. 9 shows the case of fetching an output signal every two stages of several series-connected inverter circuits 71.

FIG. 10 shows the case of fetching an output signal from each stage of several series-connected differential inverter circuits 72. As can be seen from FIG. 9, two-stage inverter circuits are required in order to obtain a non-inverted delay signal by the single-end inverter circuit 71. However, the differential inverter circuit 72 is used, and thereby, it is possible to obtain a non-inverted delay signal by one-stage inverter circuit. Therefore, the unit delay time is shortened compared with the circuit shown in FIG. 9, and further, resolution is improved.

FIG. 11 shows the configuration for improving a resolution of a delay time. For example, a plurality of delay circuit groups 73, 74, 75, . . . are configured in such a manner that several delay circuits are connected in series. The delay time of first delay circuits 74a and 75a of delay circuit groups 74 and 75 is varied slightly with respect to the delay time of first delay circuit 73a of the delay circuit groups 73. Specifically, the delay time of the delay circuit 74a is set to $\Delta\tau+\tau i$ with respect to the delay time $\tau i$ of the delay circuit 73a. The delay time of the delay circuit 75a is set to $2\Delta\tau+\tau i$. In this way, the difference is set between delay times of the delay circuit groups 73, 74, 75, . . . . A difference signal thus obtained is used, and thereby, high time resolution is realizable. In this case, the delay time difference is obtained by applying means for changing the size of transistors of inverter circuits forming a delay circuit.

Figure 12:
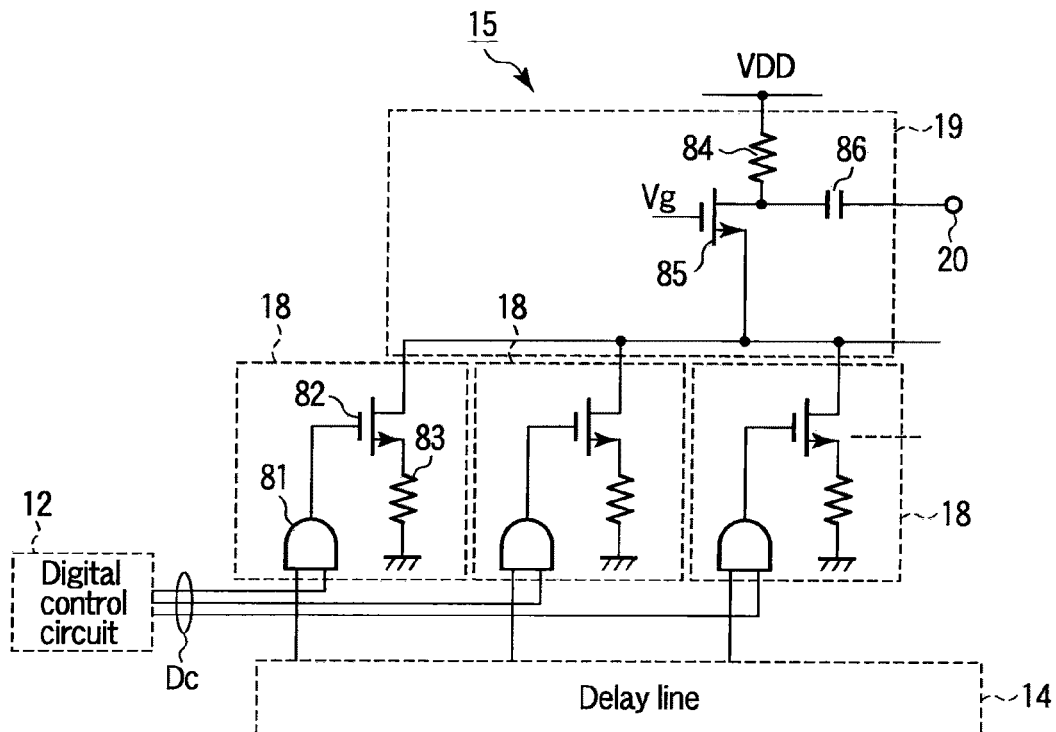
FIG. 12 is a circuit diagram showing the configuration of a selection synthesizer circuit shown in FIG. 1.

FIG. 12 shows one configuration example of a selection and synthesizer circuit 15. In this selection and synthesizer circuit 15, each switch circuit 18 comprises an AND gate 81, an N-channel MOS transistor 82, and a resistor 83. One input terminal of the AND gate 81 is supplied with the corresponding delay signal of the delay line 14 while the other terminal thereof is supplied with a control data Dc output from the digital control circuit 12. An output terminal of the AND gate 81 is connected to a gate electrode of transistor 82. The source of transistor 82 is grounded by way of the resistor 83, and the drain thereof is connected to a synthesizer circuit 19.

For example, the synthesizer circuit 19 comprises a resistor 84, an N-channel MOS transistor 85 and a capacitor 86. One terminal of the resistor 84 is connected to a node, which is supplied with a power supply VDD while the other terminal thereof is connected to the drain of the transistor. A gate electrode of transistor 85 is supplied with a signal Vg. The source of transistor 85 is connected to the drain of transistor 82 of each switch circuit 18. Further, the drain of transistor 85 is connected to an output terminal 20 by way of the capacitor 86.

According to the configuration, the switch circuit 18 receives a delay signal output from the delay line 14 when the control data Dc supplied from the digital control circuit 12 is a high level. Then, transistor 82 is turned on according to an output signal of the AND gate 81. In this way, a synthesized current of the switch circuit 18 selected by the digital control circuit 12 flows to transistor 85 of the synthesizer circuit 19. Thereafter, the current is converted into a voltage, and then, output from the output terminal. Thus, a high-frequency signal is output from the output terminal.

Figure 13:
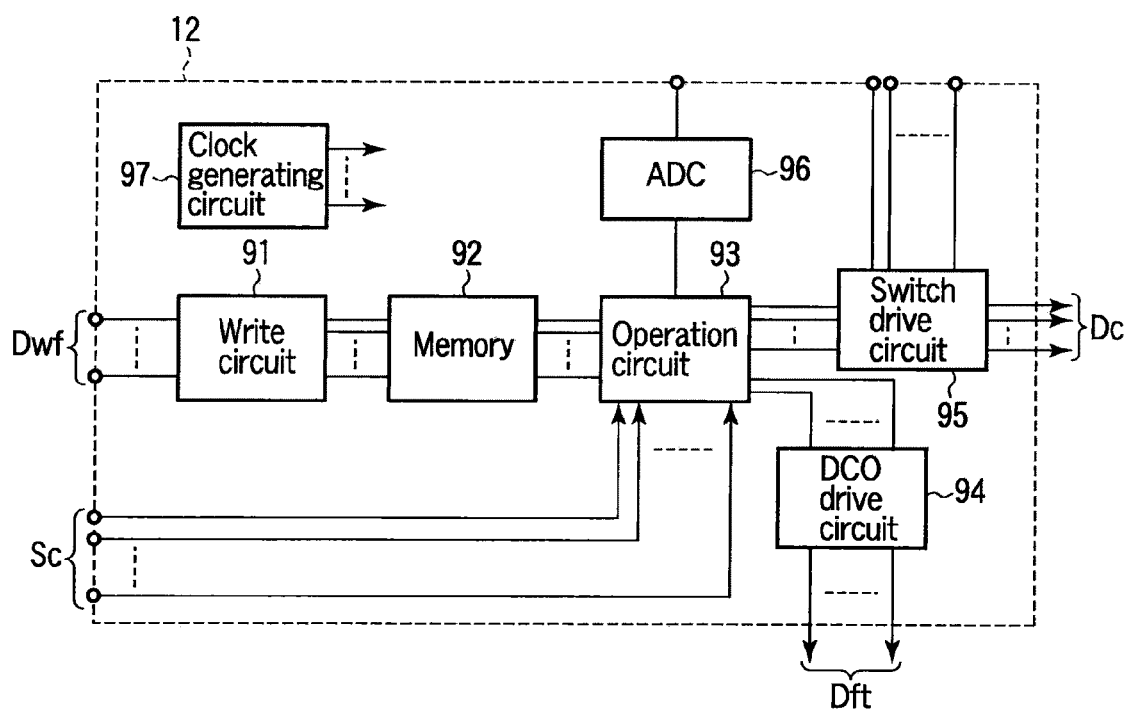
FIG. 13 is a circuit diagram showing the configuration of a data control circuit shown in FIG. 1.

FIG. 13 shows one configuration example of a digital control circuit 12. The digital control circuit 12 includes a write circuit 91, a memory 92, an operation circuit 93, a DCO drive circuit 94, a switch drive circuit 95, an analog-to-digital converter circuit (ADC) 96 and a clock generator circuit 97. Specifically, the write circuit 91 writes a waveform data Dwf supplied to an input terminal 16 to the memory 92. For example, this waveform data Dwf is basic control information of switch circuits forming the selection and synthesizer circuit 15 required for generating a sine wave and a triangular wave. The memory 92 stores the waveform data Dwf and a compensation data described later. The operation circuit 93 is a circuit having the same function as a general microcontroller, for example. The operation circuit 93 executes an operation required for generation, modulation and waveform distortion of a high-frequency signal designated according to a control signal Sc.

For example, if the control signal Sc shows a generation of a high-frequency signal, the operation circuit 93 generates a digital signal Dft for controlling the DCO 13 based on the amplitude, phase and frequency data included in the control signal Sc. Further, the operation circuit 93 reads a waveform data corresponding to a waveform designated according to the control signal Sc. Then, the operation circuit 93 generates a control data Dc showing a switch circuit to be selected by the selection and synthesizer circuit 15 based on the waveform data and various data such as amplitude, phase and frequency included in the control signal Sc. The digital signal Dft generated by the operation circuit 93 is supplied to the DCO 13 by way of the DCO drive circuit 94. Then, a control data Dc generated by the operation circuit 93 is supplied to the selection and synthesizer circuit 15 by way of the switch drive circuit 95.

In this case, a clock signal required for the operation of the data control circuit 12 is generated by the clock generator circuit 97. This clock signal is sufficient even if it is a low speed such as several hundreds of kHz or less, for example. A high-frequency signal having several hundreds of MHz or more required for the DCO 13 is not necessary.

Based on the control by the data control circuit 12, the DCO 13 and the selection and synthesizer circuit 15 are operated, and thereby, it is possible to generate a high-frequency signal having desired waveform, amplitude, phase and frequency. Moreover, based on the waveform data Dwf and the data of the control signal Sc, it is possible to generate a modulated high-frequency signal.

The operation for compensating distortion included in the generated high-frequency signal will be explained below.

According to distortion compensation, distortion characteristic is measured using a low frequency so a high-frequency signal is compensated. Therefore, the operation is carried out in a state that a high-frequency generating operation is off.

Figure 14:
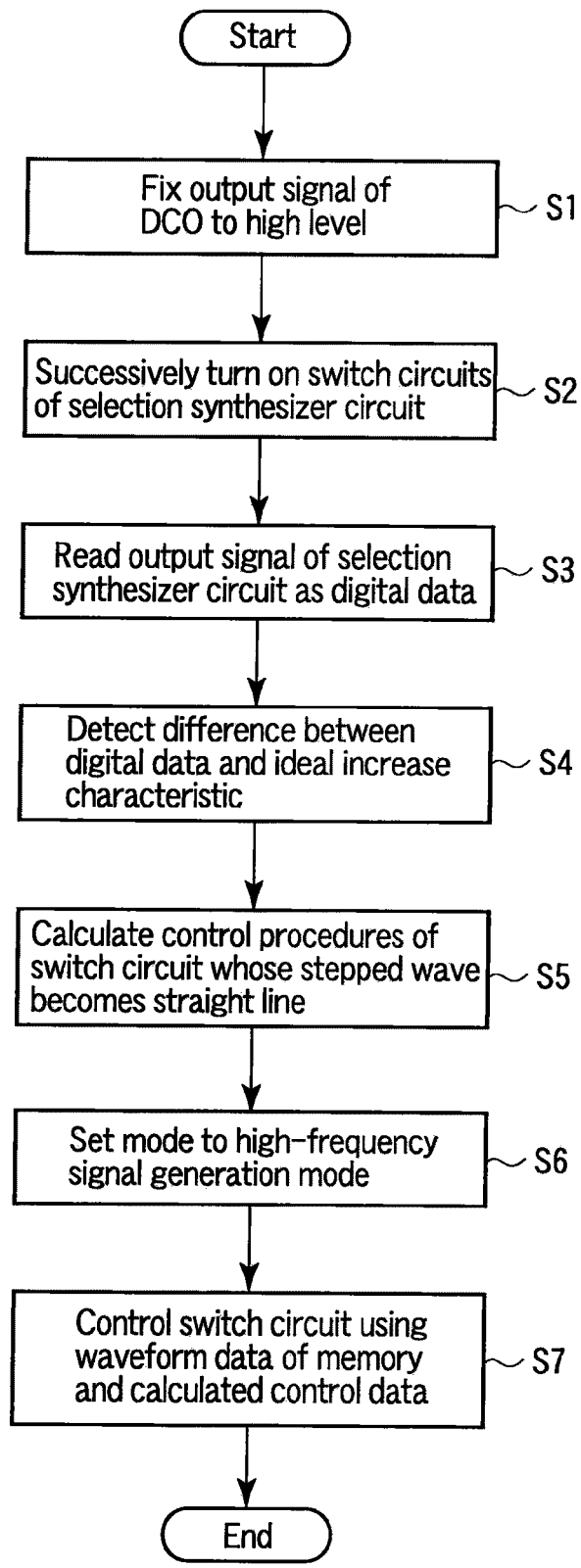
FIG. 14 is a flowchart to explain a compensation mode operation of the data control circuit shown in FIG. 13.

FIG. 14 is a flowchart to explain a distortion compensation mode operation of the data control circuit 12.

First, an output signal of the DCO 13 is fixed to a high level (S1). For this reason, all output signals of the delay line 14 are set to a high level.

Switch circuits 18 of the selection and synthesizer circuit 15 are successively turned on (S2). In this case, a low-frequency clock signal output from the clock generator circuit 97 of the digital control circuit 12 is used as a clock signal.

Switch circuits 18 are successively turned on, and thereby, the output voltage of the output terminal 20 increases at a predetermined voltage step. In other words, the output voltage of the output terminal 20 is provided as a stepped wave (ramp wave). The output voltage is digitized by the ADC 96, and thereafter, supplied to the operation circuit 93 (S3).

The operation circuit 93 detects the difference between an ideal increase characteristic of an output voltage given as reference data previously stored in the memory 92 and a digital signal supplied from the ADC 96 (S4).

FIG. 15 is a graph to explain the relationship between an ideal increase characteristic Vid given as reference data and a digital signal Vadc supplied from the ADC 96. It is preferable that the digital signal Vadc increases according to an ideal increase characteristic. However, as seen from a broken line A, the increase of the digital signal Vadc decreases due to a nonlinear operation of the selection and synthesizer circuit 15.

The operation circuit 93 calculates control data of the switch circuit 18 when the digital signal Vadc becomes a straight line based on the difference between the detected ideal increases characteristic Vid and the digital signal Vadc, and then, stores it in the memory (S5).

Specifically, if the increase of the digital signal Vadc becomes small in a high voltage range, the number of using switch circuits 18 is reduced as shown by black dots in a low voltage range, for example, and in this way, linearity is secured. Namely, the operation circuit 93 calculates the (number of) using switch circuits 18, and then, stores the calculated result as control data in the memory 92. In the manner described above, the switch circuit is reduced, and thereby, the voltage amplitude increases as seen from FIG. 15. However, a high-frequency circuit prioritizes a waveform generation having preferable linearity; therefore, the slight decrease of the amplitude has no any problem.

Thereafter, the DCO 13 is turned on, and thereafter, a high-frequency signal generation mode is set (S6). In this case, a high-frequency signal is generated based on the waveform data stored in the memory 92 and the control data of the switch circuit 18 stored in a compensation mode (S7). In other words, when the switch circuit 18 is selected based on the waveform data, the use of the switch circuit 18 is limited according to the control data. In this way, it is possible to generate a high-frequency signal having a high linearity.

In this case, according to the distortion compensation operation, distortion characteristic is measured using a low frequency, and then, a high-frequency signal is subjected to compensation. It is presumed that there is a predetermined correlation in distortion between a low frequency and a high-frequency signal. The difference in distortion between a low frequency and a high-frequency signal is compensated in a manner of previously measuring the difference between a low frequency and a high-frequency signal, and storing it in memory. In this way, high-accuracy compensation is possible. Therefore, the distortion compensation operation takes the following timing into consideration. Namely, the distortion compensation operation is carried out for a time zone having no need to generate a high-frequency signal, such as power-on time of circuit and a receiving period of a radio circuit.

Moreover, the digital control circuit 12 is a microcontroller; therefore, a microcontroller circuit is integrated on an LSI. The function of the digital control circuit 12 is realizable by program processing using hardware description language (HDL).

According to the embodiment, a pulse signal having the same frequency as a high-frequency signal to be output by the DCO 13 is generated. Further, a plurality of pulse signals having different delay is generated from the pulse signal by the delay line 14. The pulse signal thus generated is selected and synthesized by the selection and synthesizer circuit 15 based on the control data Dc supplied from the digital signal control circuit 12. Therefore, there is no need to use a clock signal having a frequency higher than a high-frequency signal to be output, unlike conventional DA and DDS. As a result, it is possible to high accurately generate a desired high-frequency signal of the order of GHz or higher at low energy consumption.

Moreover, according to the case of controlling the conventional voltage base, a power supply voltage is reduced with the scale reduction of devices, and thereby, a sufficient resolution is not obtained. As a result, it is difficult to generate a desired high-frequency signal. However, according to this embodiment, the time base of a pulse signal is controlled to generate a high-frequency signal. Therefore, even if the power supply voltage is reduced, it is possible to easily generate a desired high-frequency signal without reducing a resolution.

Figure 17:
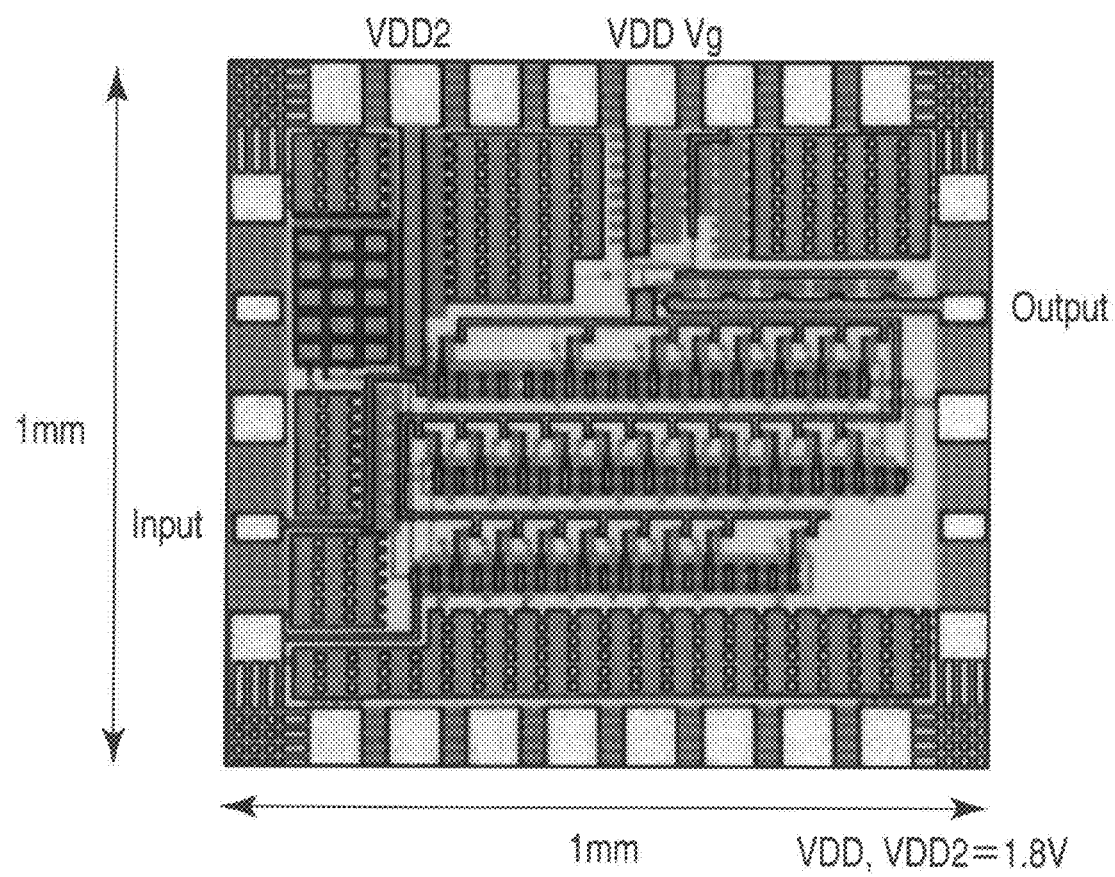
FIG. 17 is a microscope photograph showing an integrated circuit including the circuit shown in FIG. 16.

FIGS. 16 to 18B show an embodiment for the purpose of confirming the basic operation of the present invention. A trial integrated circuit chip having a built-in basic circuit of the present invention was manufactured according to the 180-nm CMOS process technique, and then, evaluated. FIG. 16 shows a trial circuit, and FIG. 17 shows a trial chip. As shown in FIG. 16, this trial circuit uses a simple (five-bit: 32 stages) inverter circuit as a delay line 14. A selection and synthesizer circuit 15 has no function of selecting a delay signal by an AND gate. For this reason, in order to fix the selection of the delay signal, two kinds of circuits, that is, a triangular wave generator circuit and a sine wave generator circuit were manufactured, and then, evaluated. FIGS. 18A and 18B each show an output waveform obtained by the evaluation. Although distortion slightly appears, it can be seen from FIGS. 18A and 18B that a triangular wave and a sine wave are synthesized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-frequency generator circuit comprising:
a signal generating circuit configured to generate a signal having the same frequency as an output signal;
a delay unit including a plurality of delay circuits, and configured to delay the signal generated by the signal generating circuit;
a selector configured to select an output signal of the delay circuits;
a synthesizer circuit configured to synthesize the signal selected by the selector, and to output the output signal; and
a controller configured to control the selector based on data for setting a waveform of the output signal and a control signal for setting at least amplitude, phase and frequency of the output signal.

2. The circuit according to claim 1, wherein the controller includes:
a memory unit configured to store data for setting the waveform; and
an operation circuit configured to operate control data for controlling the selector based on a control signal for setting said at least amplitude and frequency and data stored in the memory unit.

3. The circuit according to claim 2, wherein the operation circuit detects the difference between the output signal output from the synthesizer circuit reference data, and generates compensation data for controlling the selector based on the detected difference.

4. The circuit according to claim 2, wherein the operation circuit generates a digital signal for controlling the signal generator circuit based on a control signal for setting at least amplitude, phase and frequency of the output signal.

5. The circuit according to claim 4, wherein the signal generator circuit is a digital control oscillator circuit, which is operated based on the digital signal supplied from the operation circuit.

6. The circuit according to claim 5, wherein the digital control oscillator circuit is a ring oscillator circuit including a plurality of series-connected inverter circuits, and configured so that a signal output from an output terminal of the series-connected inverter circuits is positively fed back to an input terminal, and further, includes a variable capacitor circuit, which is connected to an output terminal of the inverter circuits and has a capacitance changed based on the digital signal.

7. The circuit according to claim 5, wherein the synthesizer circuit includes:
a plurality of switch circuits configured to select a delayed signal output from the delay unit based on control data output from the controller; and
a voltage converter circuit configured to convert a output current of the switch circuits into a voltage.

8. The circuit according to claim 4, wherein the signal generator circuit includes a plurality of series-connected differential inverter circuits, and is configured so that a signal output from an output terminal of the series-connected differential inverter circuits is positively fed back to an input terminal.

9. The circuit according to claim 8, wherein each of the differential inverter circuits comprises:
first and second transistors forming a differential pair, one terminal of a current path of the first and second transistors being connected in common; and
a variable capacitor connected between the other terminals of a current path of the first and second transistors, the variable capacitor whose capacitance is controlled by a digital signal output from the controller.

10. The circuit according to claim 4, wherein the signal generator circuit comprises:
a serial circuit including a plurality of inverter circuits connected in series; and
a plurality of switches connected between an output terminal of the serial circuit and the inverter circuits, each of the switches being controlled according to a digital signal output from the controller.

11. The circuit according to claim 1, wherein the delay unit comprises:
a plurality of inverter circuits connected in series; and
a plurality of output terminals provided for two inverter circuits.

12. The circuit according to claim 1, wherein the delay unit comprises:
a plurality of differential inverter circuits connected in series; and
a plurality of output terminals provided for each the differential inverter circuit.

13. The circuit according to claim 1, wherein the delay unit comprises:
a plurality of delay circuit groups,
each delay circuit group including a plurality of inverter circuits connected in series,
one inverter circuit of each delay circuit group having a delay time different from one inverter circuit of other delay circuit groups.

* * * * *